United States Patent
Wong et al.

(10) Patent No.: US 7,199,624 B2
(45) Date of Patent: Apr. 3, 2007

(54) PHASE LOCKED LOOP SYSTEM CAPABLE OF DESKEWING

(75) Inventors: Keng L. Wong, Portland, OR (US); Gregory F. Taylor, Portland, OR (US); Chee How Lim, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/425,914

(22) Filed: Apr. 30, 2003

(65) Prior Publication Data

US 2004/0217787 A1 Nov. 4, 2004

(51) Int. Cl.
*H03L 7/06* (2006.01)

(52) U.S. Cl. ........................ 327/149; 327/158

(58) Field of Classification Search ............... 327/149, 327/153, 156, 158, 161, 295; 375/371–376; 331/17, 25, DIG. 2
See application file for complete search history.

(56) References Cited

U.S. PATENT DOCUMENTS

| | | | | |
|---|---|---|---|---|
| 5,859,550 A | * | 1/1999 | Brandt | 327/156 |
| 5,870,445 A | * | 2/1999 | Farwell | 375/371 |
| 6,100,735 A | * | 8/2000 | Lu | 327/158 |
| 6,288,589 B1 | * | 9/2001 | Potter et al. | 327/295 |
| 6,294,938 B1 | | 9/2001 | Coddington et al. | 327/158 |
| 6,300,807 B1 | * | 10/2001 | Miyazaki et al. | 327/158 |
| 6,346,838 B1 | * | 2/2002 | Hwang et al. | 327/156 |
| 6,608,528 B2 | * | 8/2003 | Tam et al. | 331/2 |
| 2003/0052343 A1 | | 3/2003 | Magoshi | 257/233 |
| 2003/0155949 A1 | * | 8/2003 | Itkin et al. | 327/105 |

OTHER PUBLICATIONS

PCT Search Report EPO, Apr. 30, 2003.

* cited by examiner

*Primary Examiner*—Linh My Nguyen
(74) *Attorney, Agent, or Firm*—Blakely, Sokoloff, Taylor & Zafman LLP (57) ABSTRACT

A system is provided that includes a phase lock loop component to output a first signal based on a reference clock signal and a feedback clock signal. A clock distribution network may distribute a clock signal based on the first signal output from the phase lock loop component. Additionally, a delay lock loop component may deskew a signal and adjust the clock signal distributed by the clock distribution network.

15 Claims, 12 Drawing Sheets

PHASE LOCKED LOOP SYSTEM CAPABLE OF DESKEWING

FIELD

The present disclosure relates to the field of phase locked loop systems. More specifically, the present disclosure relates to the technology of clock signal distribution using a phase locked loop system.

BACKGROUND

The need and application for clock generation is ubiquitous. Clock generation may be accomplished using phase-locked loop (PLL) circuitry. PLL circuitry generally takes a reference signal, such as a system clock, compares it to a feedback signal, and generates an error signal in response thereto. The error signal drives a voltage controlled oscillator (VCO) that produces an output clock signal. The output clock signal is also scaled (typically with a divider) to generate the feedback signal for comparison with the reference signal. The divisor setting of the divider sets the frequency ratio between the reference and output clock signals. For example, if the divisor is set to three, the output clock signal will have a frequency 3 times the frequency of the reference signal.

PLL circuitry may eliminate or substantially reduce temporal skew between the reference signal and the output signal with proper phase comparator design. Eliminating skew is critical in applications such as, but not limited to, I/O interface timing specifications of a modern microprocessor.

In recent years, the clock distribution delay (and thus the PLL feedback delay) has increased while the PLL reference frequency is rising. Both of these factors may result in degraded PLL performance. Additionally, the clock distribution may exceed a few output clock cycles in delay. Other structures may be added in series with the clock distribution to contribute to a longer feedback loop delay. These may include clock stretch/shrink DFT, modulation of clock sensitivity to power supply, PLL phase-frequency detector output filtering ("chopping"), etc.

One method to alleviate the problem of the increased clock distribution delay is to lower the reference frequency of the PLL circuit. However, this results in high synthesis ratios, which may necessitate a large filter capacitor. Another method may allow for the destination internal clock to be misaligned from the external reference. However, this may occur at the expense of tighter timing margins across clock domains or require asynchronous timing transfer.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto.

The following represents brief descriptions of the drawings in which like numerals represent like elements and wherein.

DETAILED DESCRIPTION

In the following detailed description, like reference numerals and characters may be used to designate identical, corresponding or similar components in different figure drawings. While embodiments of the present invention may be described with respect to example circuits, the implementation of these circuits may be accomplished in any one of several ways, including but not limited to logic circuits, circuit elements provided within a microchip or integrated circuit as well as software implementation of the respective functions. Each of these implementations is within the scope of the present invention. Embodiments of the present invention may also be described with respect to signals being input or output from different circuit components. It is understood that while the discussion identifies a signal, the signal may be transmitted over a signal line or similar type of mechanism. Further, the terminology signal may also correspond to a signal line as shown in the drawings. Additionally, well known power/ground and address connections to components may not be shown within the Figures for simplicity of illustration and discussion, and so as not to obscure the invention.

Figure 1:
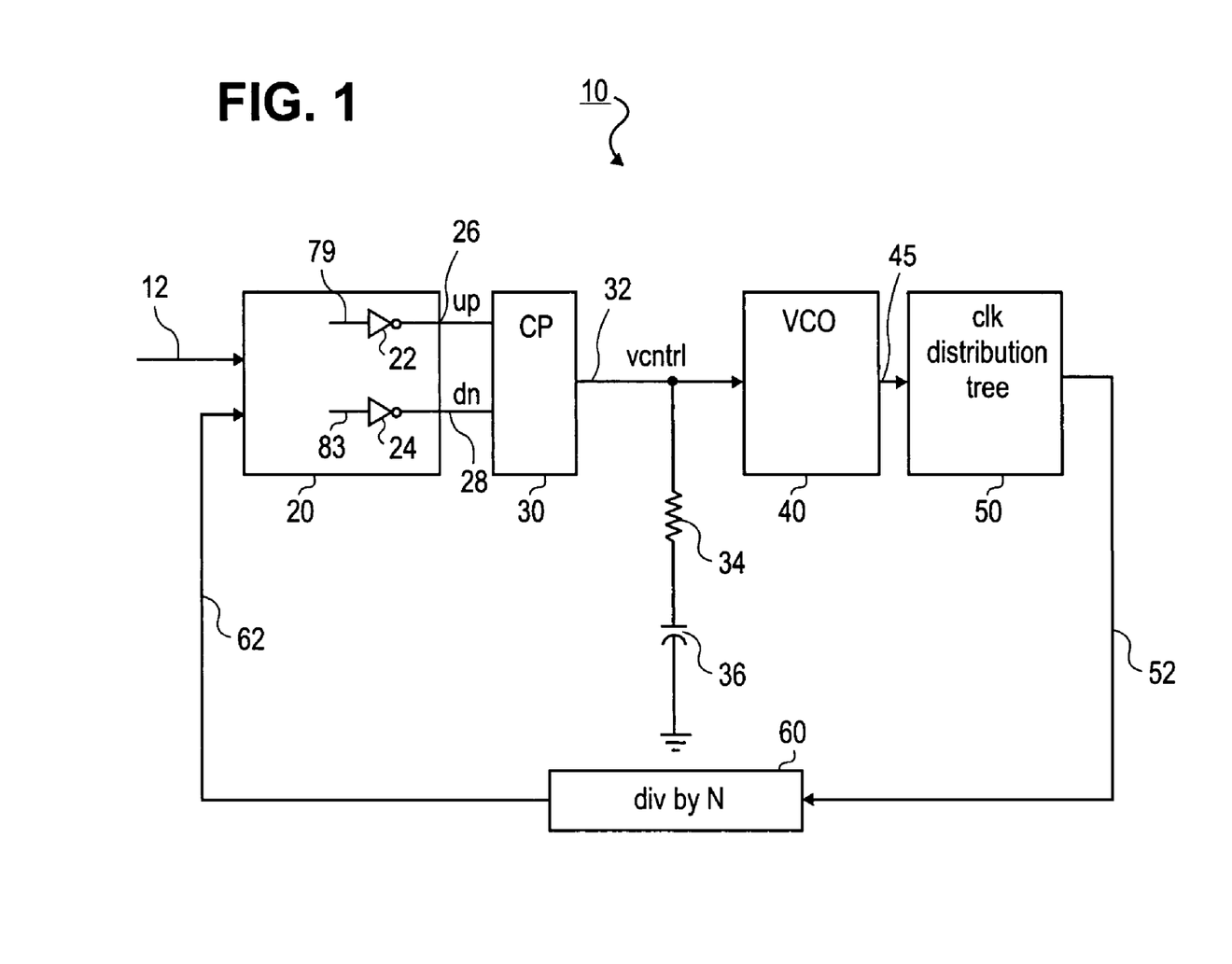
FIG. 1 is a circuit diagram of an example clocking system according to one arrangement.

FIG. 1 shows a clocking system 10 according to one arrangement. Other arrangements are also possible. The clocking system 10 includes a phase frequency detector (PFD) 20, a charge pump (CP) 30, a voltage controlled oscillator (VCO) 40, a clock distribution tree 50 (hereafter also called a clock distribution network) and a divide-by-N counter 60 (hereafter also called a divide-by-N circuit). A reference clock signal 12 is applied to an input of the phase frequency detector 20. The reference clock signal 12 may be provided by an external clocking source. That is, the clocking source may be external to a microchip or integrated circuit containing the clocking system 10. A feedback clock signal 62 may also be applied to an input of the phase frequency detector 20. The phase frequency detector 20 generates a signal 79 and a signal 83 based on the reference clock signal 12 and the feedback clock signal 62. The signal 79 is applied to an input of an inverter circuit 22 that provides an up signal 26. The signal 83 is applied to an input of an inverter circuit 24 that provides a down signal 28. The up signal 26 and the down signal 28 are applied to input terminals of the charge pump 30. That is, the phase frequency detector 20 compares the phase of the reference clock signal 12 and the feedback clock signal 62 and provides the up signal 26 and the down signal 28 to input terminals of the charge pump 30. The up and down signals 26, 28 indicate respective positive and negative charge directions for the charge pump 30. The charge pump 30 converts the digital inputs (i.e., produces a voltage control signal 32 based on the up and down signals 26 and 28) to an analog current (or signal) which is then integrated by a loop filter to generate a voltage control signal 32. The voltage control signal 32 is applied to the VCO 40 for varying the frequency of the VCO clock signal 45 that is input to the clock distribution tree 50.

The clock distribution tree 50 produces a signal 52 that is applied to the divide-by-N counter 60 that in turn produces the feedback clock signal 62. The signal 52 produced by the clock distribution tree 50 also becomes the clock signal that will input to the state machines (or other elements/components) on the microchip or integrated circuit. As discussed above, the feedback clock signal 62 is applied to an input of the phase frequency detector 20.

A filter, such as a second order filter, may also be provided between the charge pump 30 and the voltage controlled oscillator 40. The second order filter may include a resistor 34 and a capacitor 36 coupled to ground. Other types of filters may also be used. The up signal 26 and the down signal 28 charge or discharge the capacitor 36. This, in turn, decreases or increases the voltage of the voltage control signal 32 applied to the VCO 40. The VCO 40 determines the frequency output of the VCO clock signal 45. Stated differently, the up signal 26 and the down signal 28 are used to determine the frequency output of the VCO 40.

The phase frequency detector 20 generates the phase difference between the up signal 26 and the down signal 28 to be substantially equal to the phase difference between the reference clock signal 12 and the feedback clock signal 62. In particular, the phase difference of the reference clock signal 12 and the feedback signal 62 is copied and realized by the difference in the duration of the up and down signals 26 and 28. When the feedback clock signal 62 is slower than the reference clock signal 12 (i.e., the feedback clock signal is lagging), then the duration of the up signal 26 may be larger than the duration of the down signal 28. This increases the frequency of the VCO clock signal 45. On the other hand, when the VCO clock signal 45 is faster than the reference clock signal 12 (i.e., the feedback clock signal is leading), then the duration of the down signal 28 may be larger than the duration of the up signal 26. This decreases the frequency of the VCO clock signal 45.

Figure 2A:
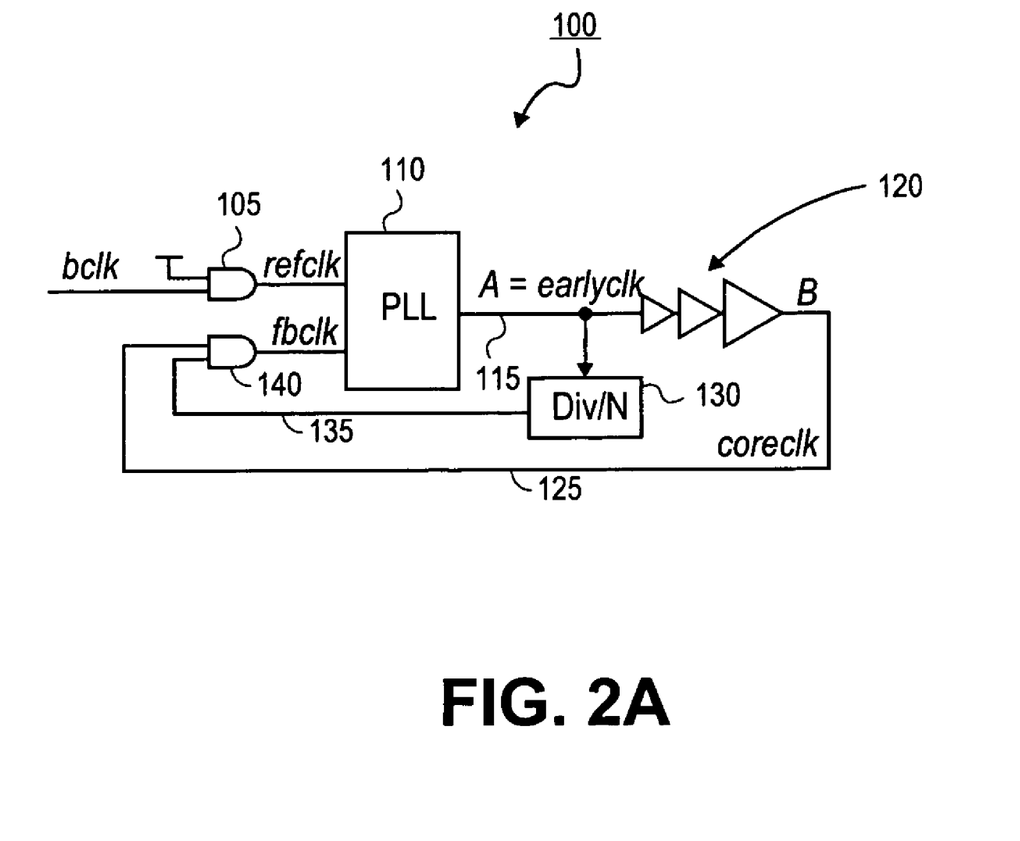
FIG. 2A is a circuit diagram of an example clocking system according to one arrangement.

FIG. 2A is a circuit diagram of an example clocking system 100 according to one arrangement. Other arrangements are also possible. FIG. 2A shows a phase lock loop (PLL) circuit 110 that receives a reference clock signal (shown as refclk) and a feedback clock signal (shown as fbclk). The refclk signal may correspond with the reference clock signal 12 (FIG. 1) and the fbclk signal may correspond with the feedback clock signal 62 (FIG. 1). The refclk signal may be obtained from a bus clock signal (shown as bclk) that is input to a logical AND gate 105. The bus clock signal may also be called a system clock signal. The other input of the logical AND gate 105 may be coupled to a HIGH voltage source. Similar to the arrangement discussed above with respect to FIG. 1, the PLL circuit 110 outputs a signal (shown as earlyclk) along signal line 115 (corresponding to node A) based on the fbclk signal and the refclk signal. The earlyclk signal may be input to a divide-by-N circuit 130, which in turn produces a signal that is fed back to a logical AND gate 140 along signal line 135. Additionally, the earlyclk signal on the signal line 115 (at node A) may be input to a clock distribution network (shown generally as element 120). The signal(s) produced by the clock distribution network 120 becomes the core clock signal that will be input to the state machines (or other elements/components) on the microchip or integrated circuit. Node B represents one point of usage of the clock signal on the die. This clock signal at node B may then be fed back as the core clock signal (shown as coreclk) along signal line 125 to another input of the logical AND gate 140. The logical AND gate 140 performs a logical AND operation on the input signals and outputs a feedback signal (shown as fbclk) to the PLL circuit 110.

However, the clock distribution delay may be ignored during the PLL loop design. This delay therefore exists within the PLL feedback loop and may be corrected by example embodiments of the present invention.

Figure 2B:
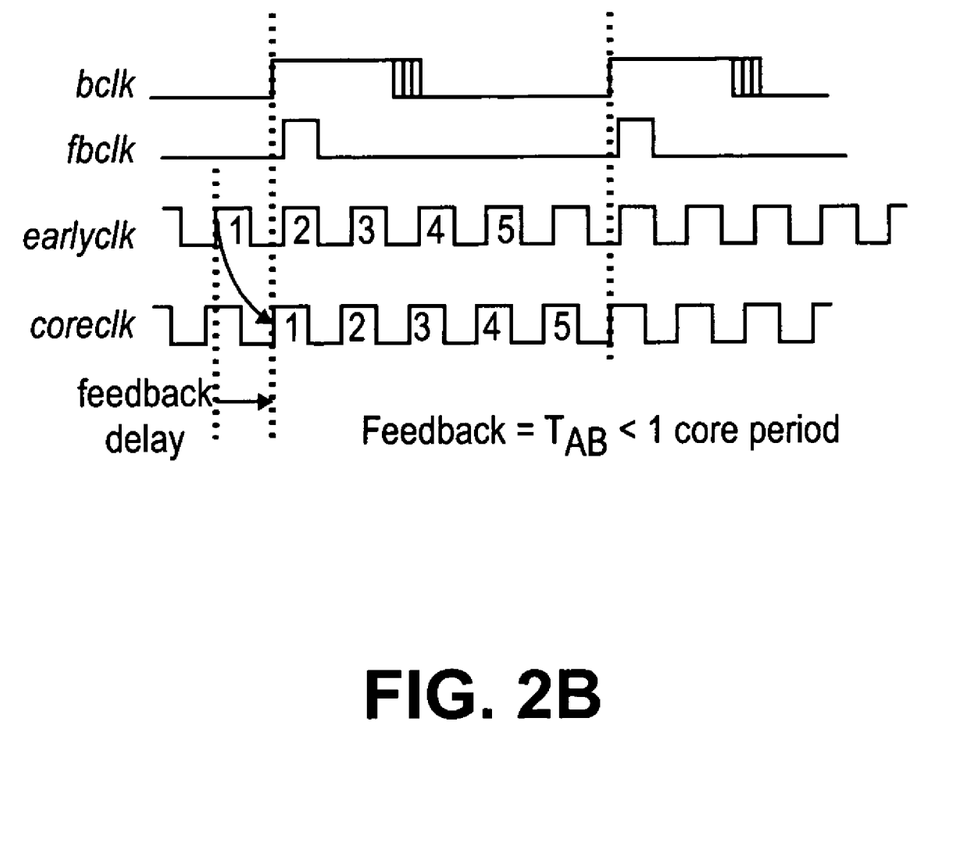
FIG. 2B is a timing diagram for the FIG. 2A circuit diagram.

FIG. 2B is a timing diagram showing the various signals of FIG. 2A over a period of time. For example, FIG. 2B shows the bus clock (bclk) signal and the feedback (fbclk) signal that are input to the PLL circuit 110. FIG. 2B also shows the signal at node A (i.e., the earlyclk signal) and the signal at node B (i.e., the coreclk signal). The difference in the signals at node A and node B represents the feedback delay (caused by the clock distribution network 120, for example). In this example, the feedback is represented as $T_{AB}$, which is less than 1 core period.

Figure 3:
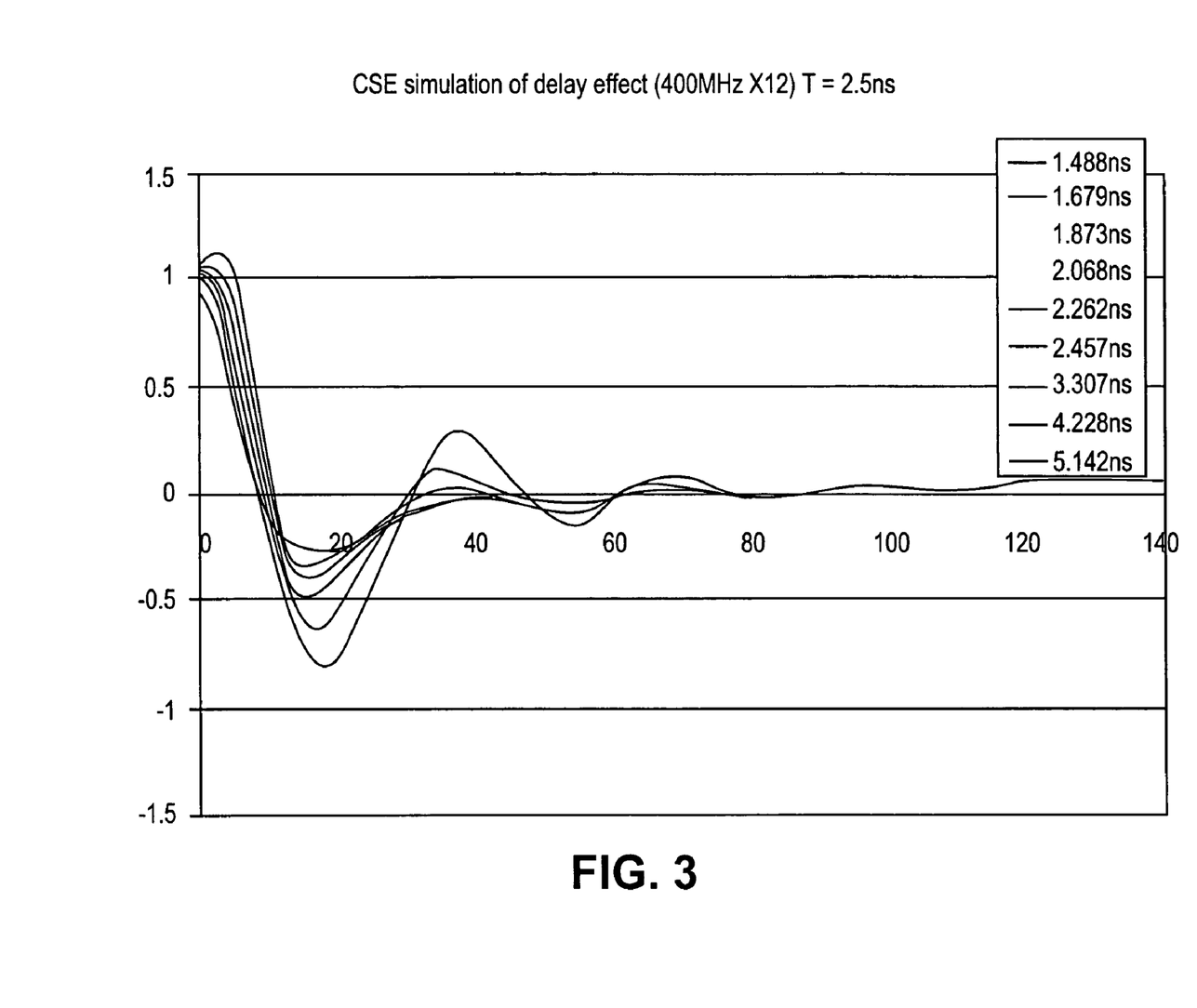
FIG. 3 is a graph showing a damping factor degradation of a phase lock loop circuit as its feedback delay increases.

FIG. 3 is a graph showing a damping factor degradation of a PLL as its feedback delay gets longer and longer. That is, the damping factor may go lower as the delay gets longer. The system may become more underdamped. An underdamped PLL system may be more oscillatory and therefore more jittery in responding to input phase or supply noise.

As discussed above, in recent years, the clock distribution delay (and thus the PLL feedback delay) has increased while the PLL reference frequency is rising. That is, the phase alignment is increasing because the clock distribution network is getting longer. As the delay increases, the PLL needs to deskew a larger range. If the PLL is required to deskew a range greater than half a reference period, then the characteristics of the PLL degrade.

Embodiments of the present invention may provide a method and apparatus to generate and deskew an internal clock while accommodating a long clock distribution delay. The clock distribution may be incorporated outside the PLL feedback loop. As one example, the PLL loop delay (to be deskewed) may include the amount of delay from a VCO output, through any buffers and clock dfts, through a phase detector and through a charge pump. Embodiments of the present invention may deskew the internal clock using a delay locked loop. Embodiments of the present invention may provide a short PLL feedback thereby avoiding loop instability. The delay locked loop may align an internal point (or node) to an external reference. Embodiments of the present invention may also have a total DLL range of 1 core clock period. The delay line control may be slaved from the VCO analog control in order to achieve maximum dynamic range (i.e., operational over the frequency range of the VCO).

Figure 4A:
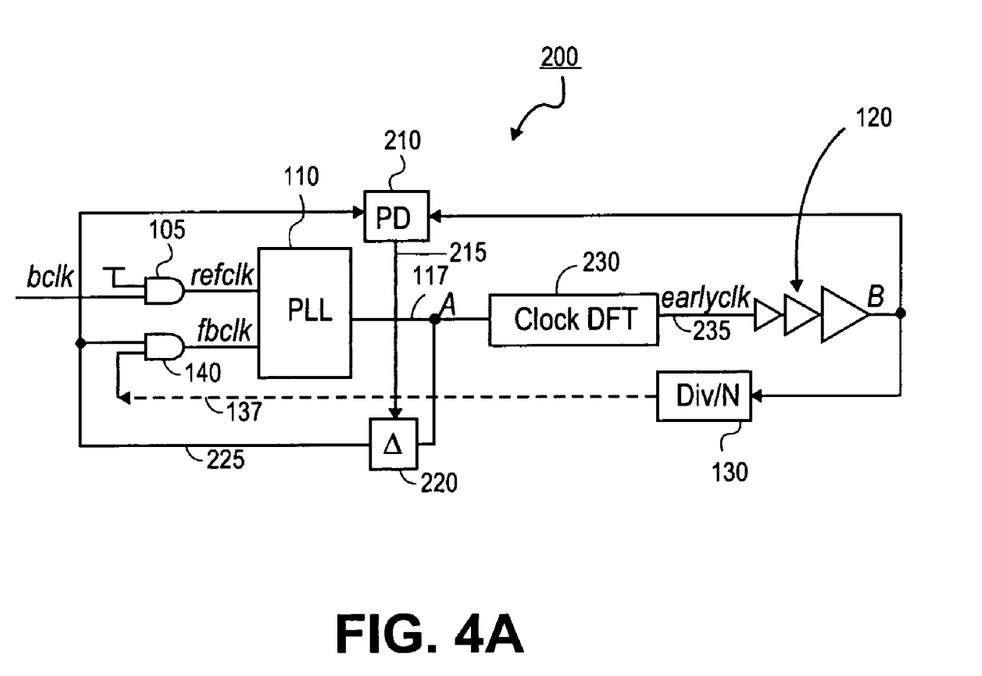
FIG. 4A is a circuit diagram of an example clocking system according to an embodiment of the present invention.

FIG. 4A is a circuit diagram of a clocking system 200 according to an example embodiment of the present invention. Other embodiments and configurations are also within the scope of the present invention. The FIG. 4A clocking system 200 includes both a PLL component and a delay locked loop (DLL) component. For example, the PLL component may perform frequency modulation/modification (such as a frequency multiplier) while the DLL component may perform phase alignment (such as deskewing). The PLL component may include the PLL circuit 110 while the DLL component may include a phase detector (PD) 210 and a variable delay circuit 220.

In the FIG. 4A clocking system 200, the feedback delay includes a variable delay (shown as the variable delay circuit 220). The variable delay may have a range of up to 2 core clock periods. By changing the variable delay, the core clock output of the clock distribution network 120 may be aligned with the external clock (i.e., the bclk signal). This change may be affected by the DLL component including the variable delay circuit 220 and the phase detector 210 (comparing the core clock signal and the PLL reference clock signal). As will be described below, the phase detector 210 compares the two input signals (i.e., the core clock signal and the PLL reference clock signal) and provides an output signal (hereafter also called the adjustment signal) along signal line 215 to the variable delay circuit 220. The output of the variable delay circuit 220 may thereby be varied based on the adjustment signal received from the phase detector 210. Stated differently, the phase detector 210 changes the variable delay until the inputs of the phase detector 210 are aligned.

In FIG. 4A, the PLL circuit 110 receives the reference clock signal (shown as refclk) and the feedback clock signal (shown as fbclk) in a similar manner as discussed above with respect to FIG. 2A. That is, the bus clock signal (shown as bclk) may be input to the logical AND gate 105. The other input of the logical AND gate 105 may be coupled to a HIGH voltage source. Based on the refclk signal and the fbclk signal, the PLL circuit 110 outputs a signal along a signal line 117 (corresponding to the node A) to a clock design for test circuit (or clock dft circuit) 230. The clock dft circuit 230 represents circuit elements that add delays in the clock signal propagation. These delays may be in addition to those of the clock distribution network 120. The clock dft circuit 230 outputs the early clock signal (shown as earlyclk signal) along signal line 235 to the clock distribution network 120. As discussed above, the signals produced by the clock distribution network 120 become the clock signals that will be input to the state machines (or other elements/components) on the microchip or integrated circuit. The core clock signal at node B may be input to the divide-by-N circuit 130. The divide-by-N circuit 130 outputs the resulting signal along signal line 137 to one input of the logical AND gate 140.

The phase detector 210 receives two inputs, namely the core clock signal and the feedback clock signal from the variable delay circuit 220. Based on these input signals, the phase detector 210 outputs the adjustment signal along signal line 215 to the variable delay circuit 220. The variable delay circuit 220 also receives the clock signal at node A as one of its inputs. The variable delay circuit 220 thereby adjusts the clock signal fed back to the logical AND gate 140 along signal line 225 based on the adjustment signal received along the signal line 215 from the phase detector 210. The logical AND gate 140 performs a logical AND operation on the feedback signals of the signal lines 137 and 225 and outputs the feedback (fbclk) signal to the PLL circuit 110. Stated differently, the signal at node A (and thus the core clock signal) may be modulated in time until the signal at node B aligns up with the feedback clock signal. In this embodiment, the variable delay circuit 220 is inside the PLL loop. Therefore, as the DLL component is locking, the PLL component may also be locking.

Figure 4B:
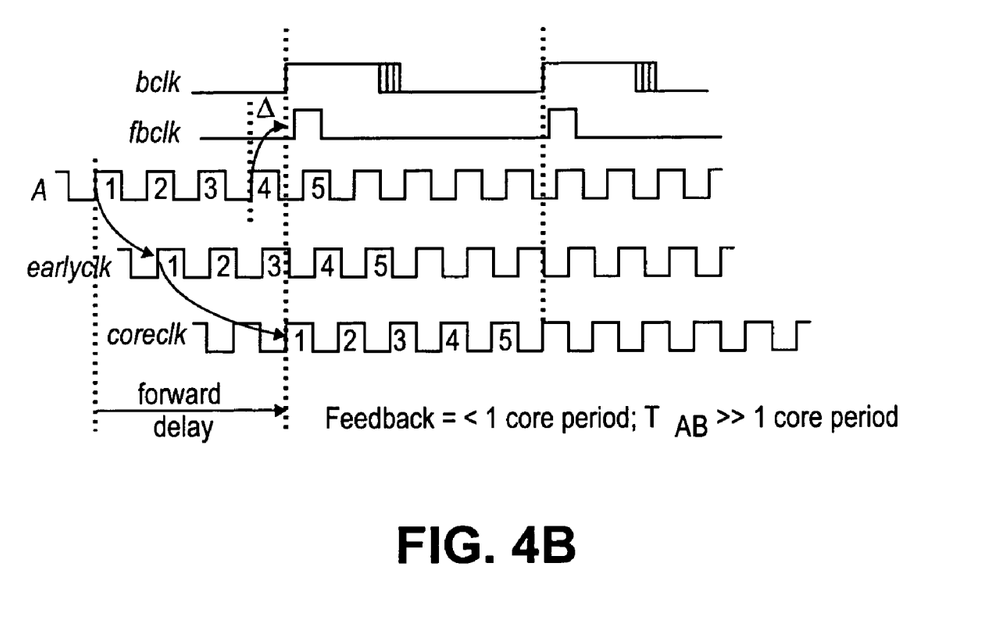
FIG. 4B is a timing diagram for the FIG. 4A circuit diagram.

FIG. 4B is a timing diagram showing the various signals of FIG. 4A over a period of time. For example, FIG. 4B shows the bus clock (bclk) signal and the feedback (fbclk) signal input to the PLL circuit 110. FIG. 4B also shows the signal at node A, the earlyclk signal, and the signal at node B (i.e., the coreclk signal). The difference in the signals at node A and node B represents the forward delay (caused by the clock dft circuit 230 and the clock distribution network 120, for example). As shown, the forward delay between node A and node B ($T_{AB}$) is much greater than 1 core clock period. In this example, the feedback is less than 1 core period.

Figure 5A:
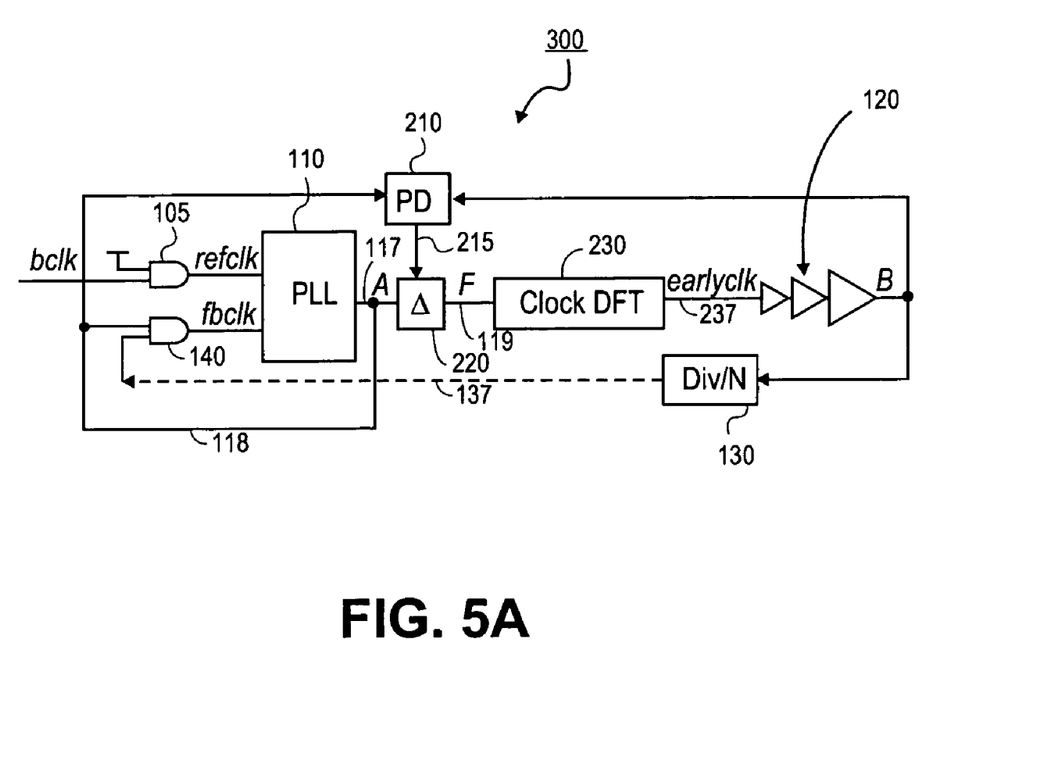
FIG. 5A is a circuit diagram of an example clocking system according to an embodiment of the present invention.

FIG. 5A is a clocking system 300 according to an example embodiment of the present invention. Other embodiments and configurations are also within the scope of the present invention. The FIG. 5A clocking system 300 also includes a PLL component and a DLL component. As will be described below, the phase detector (PD) 210 may compare two input clocks and provide an adjustment signal along the signal line 215 to the variable delay circuit 220. The variable delay circuit 220 may thereby adjust the signal output to the clock dft circuit 230 based on the adjustment signal received from the phase detector 210 along the signal line 215. That is, the DLL component (including the variable delay circuit 220) may change the variable delay such that the output of the clock distribution network 120 is aligned with an external clock (i.e. the bclk signal). In this embodiment, the variable delay circuit 220 is provided outside the PLL feedback loop. Therefore, the operation of the DLL components may be independent of the PLL components.

In FIG. 5A, the PLL circuit 110 receives the reference clock signal (shown as refclk) and the feedback clock signal (shown as fbclk) in a similar manner as discussed above with respect to FIG. 2A. That is, the bus clock signal may be input to the logical AND gate 105. The other input of the logical AND gate 105 may be coupled to a HIGH voltage source. Based on the refclk signal and the fbclk signal, the PLL circuit 110 outputs a signal along the signal line 117 (corresponding to the node A) to the variable delay circuit 220. The variable delay circuit 220 outputs a signal along signal line 119 (corresponding to node F) to the clock dft circuit 230. The signal at node A is also fed back along signal line 118 to one input of the logical AND gate 140. The clock dft circuit 230 outputs the early clock signal (shown as earlyclk signal) along signal line 235 to the clock distribution network 120. The signal at node B may be input to the divide-by-N circuit 130. The divide-by-N circuit 130 outputs the resulting signal along signal line 137 to one input of the logical AND gate 140.

The phase detector 210 receives two inputs, namely the core clock signal (from node B) and the feedback clock signal along signal line 118 from node A. Based on these signals, the phase detector 210 outputs the adjustment signal along the signal line 215 to the variable delay circuit 220. The variable delay circuit 220 thereby adjusts the clock signal input to the clock dft circuit 230 based on the adjustment signal received along the signal line 215 from the phase detector 210. The logical AND gate 140 performs a logical AND operation on the feedback signals of the signal lines 137 and 118 and outputs the feedback clock (fbclk) signal to the PLL circuit 110.

In the FIG. 5A clocking system 300, the variable delay is located outside the PLL feedback loop. The DLL component of the clocking system includes the phase detector 210 (comparing the core and PLL reference clocks) and the variable delay circuit 220, which has a range of at most 2 core clock periods. The PLL and DLL closed loop operations may thereby be independent of each other.

Figure 5B:
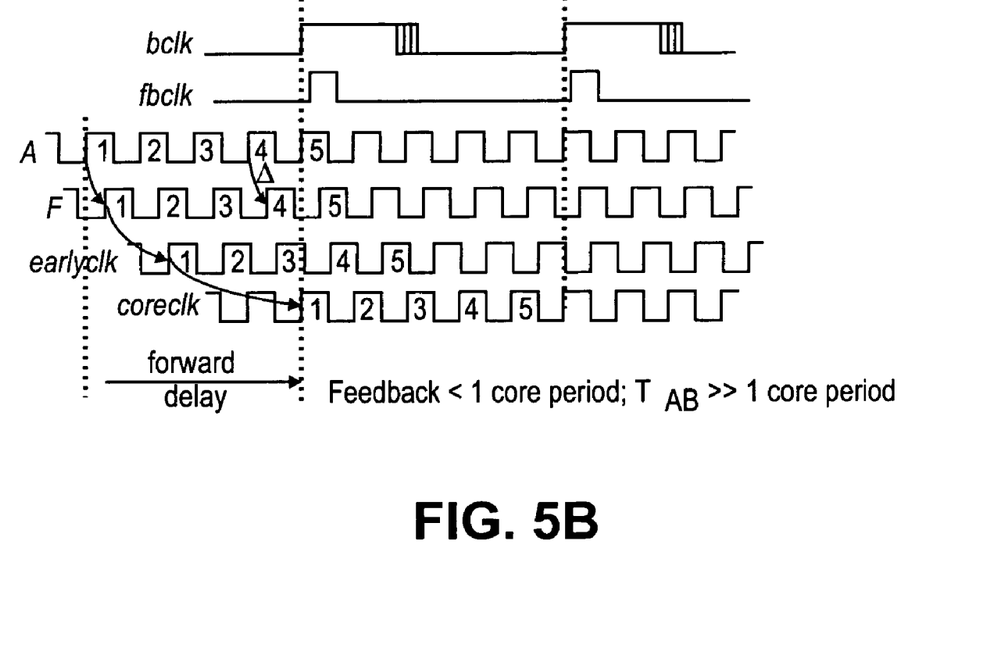
FIG. 5B is a timing diagram for the FIG. 5A circuit diagram.

FIG. 5B is a timing diagram showing the various signals of FIG. 5A over a period of time. For example, FIG. 5B shows the bus clock (bclk) signal and the feedback (fbclk) signal input to the PLL circuit 110. FIG. 5B also shows the signal at node A, the signal at node F, the earlyclk signal, and the signal at node B (i.e., the coreclk signal). The difference in the signals at node A and node B represents the forward delay (caused by the clock dft circuit 230 and the clock distribution network 120, for example). As shown, the forward delay between node A and node B ($T_{AB}$) is much greater than 1 core clock period. In this example, the feedback is less than 1 core period.

Figure 6:
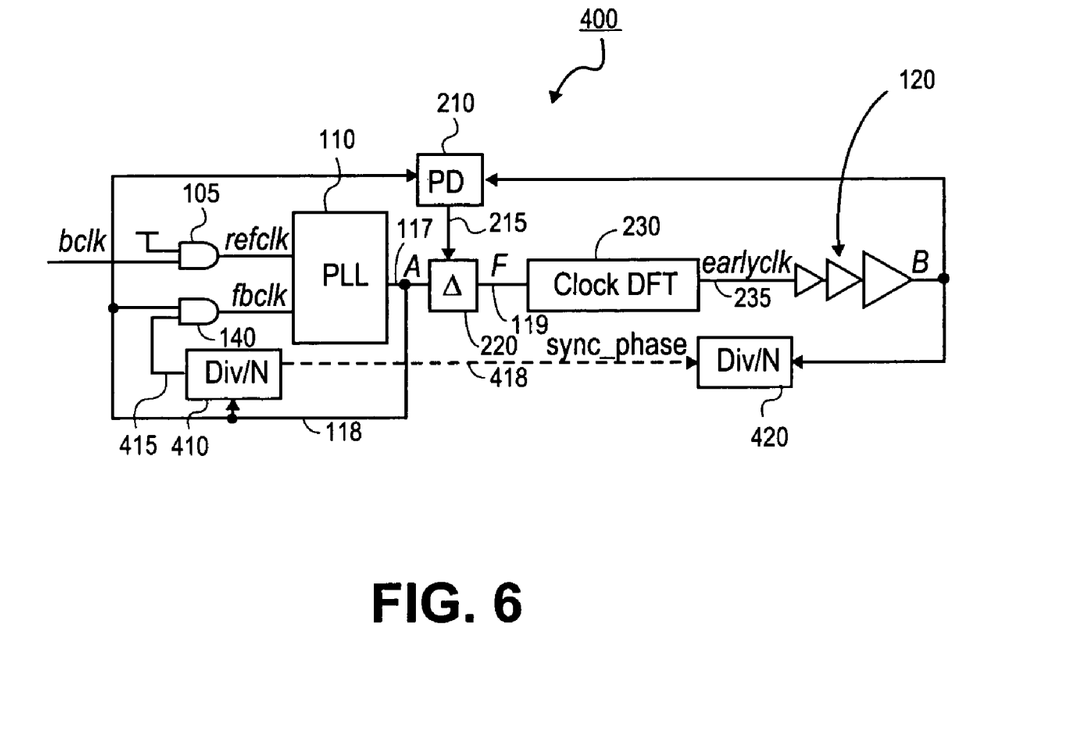
FIG. 6 is a circuit diagram of an example clocking system according to an embodiment of the present invention.

FIG. 6 is a clocking system 400 according to an example embodiment of the present invention. Other embodiments and configurations are also within the scope of the present invention. The FIG. 6 clocking system 400 also includes a PLL component and a DLL component. As will be described below, the phase detector 210 may compare two input clocks and provide an adjustment signal along the signal line 215 to the variable delay circuit 220. The FIG. 6 clocking system 400 is similar to the clocking system 300 shown in FIG. 5A and additionally includes two divide-by-N circuits (shown as a primary divide-by-N circuit 410 and a secondary divide-by-N-circuit 420). These two divide-by-N circuits are provided so that the PLL components may lock and then the primary divide-by-N circuit 410 may send a signal to the secondary divide-by-N circuit 420 to synchronize the components. Then, the secondary divide-by-N circuit 420 may be operated in a lock-step with the primary divide-by-N circuit 410.

In FIG. 6, the PLL circuit 110 receives the reference clock signal (shown as refclk) and the feedback clock signal (shown as fbclk) in a similar manner as discussed above with respect to FIG. 2A. That is, the bus clock signal may be input to the logical AND gate 105. The other input of the logical AND gate 105 may be coupled to a HIGH voltage source. Based on the refclk signal and the fbclk signal, the PLL circuit 110 outputs a signal along the signal line 117 (corresponding to the node A) to the variable delay circuit 220. The variable delay circuit 220 outputs a signal along signal line 119 (corresponding to the node F) to the clock dft circuit 230. The signal at node A is also fed back along signal line 118 to one input of the logical AND gate 140. The clock dft circuit 230 outputs the early clock signal (shown as earlyclk signal) along the signal line 235 to the clock distribution network 120.

The phase detector 210 receives two inputs, namely the core clock signal (from node B) and the feedback clock signal along signal line 118 from node A. Based on these signals, the phase detector 210 outputs the adjustment signal along the signal line 215 to the variable delay circuit 220. The variable delay circuit 220 thereby adjusts the clock signal fed to the clock dft circuit 230 based on the adjustment signal received along signal line 215 from the phase detector 210.

The signal at node A (on signal line 117) is also input to the primary divide-by-N circuit 410. The primary divide-by-N circuit 410 outputs the resulting signal along signal line 415 to one input of the logical AND gate 140. The logical AND gate 140 performs a logical AND operation on the feedback signals of the signal lines 415 and 118 and outputs the feedback clock (fbclk) signal to the PLL circuit 110. The primary divide-by-N circuit 410 is used to lock the PLL. After the PLL locks, phase information (shown as sync_phase) from the primary divide-by-N circuit 410 is sent to the secondary divide-by-N circuit 420 along signal line 418. After this synchronization, both the primary divide-by-N circuit 410 and the secondary divide-by-N circuit 420 are in digital lock-step. The secondary divide-by-N circuit 420 may create an internal bus clock signal that is used in I/O communication of the chip with external components. For example, the signal from the secondary divide-by-N circuit 420 may be AND'd with the core clock signal to generate the internal bus clock.

Figure 7A:
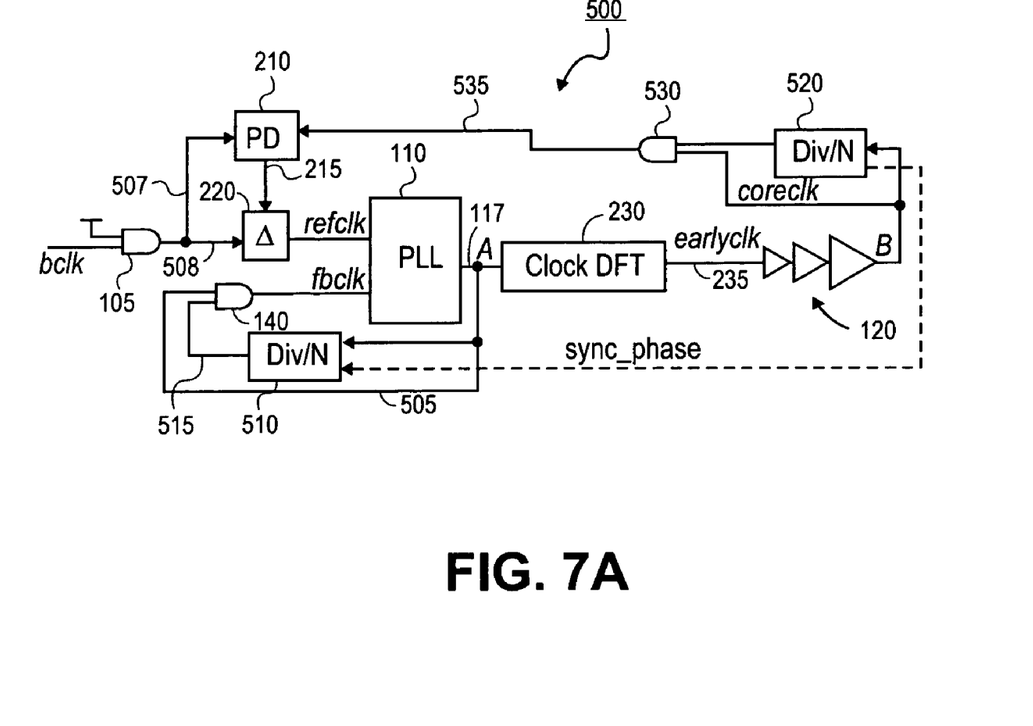
FIG. 7A is a circuit diagram of an example clocking system according to an embodiment of the present invention.

FIG. 7A is a circuit diagram of a clocking system 500 according to an example embodiment of the present invention. Other embodiments and configurations are also within the scope of the present invention. The FIG. 7A clocking system 500 also includes a PLL component and a DLL component. However, in this embodiment, the PLL component (namely the PLL circuit 110) is slaved inside the DLL component. That is, the DLL component is provided within the reference path of the PLL component. Similar to discussed above, the DLL component may act as a deskew element (or phase aligner) while the PLL component may act as a frequency multiplier (or frequency modulator). In this embodiment, the DLL component may operate at a slower reference frequency compared to the above embodiments and therefore the timings involved in the design may be simpler. The PLL component may be shifted as its reference clock is modulated by the DLL component. Still further, the bandwidths of the DLL and PLL components may be separated in frequency in order to avoid undesired interaction between the two loops. The primary divide-by-N circuit and the secondary divide-by-N circuit may be synchronized to each other by having the secondary divide-by-N circuit (i.e., the coreclk divider) send a sync_phase signal to the primary divide-by-N circuit (i.e., the PLL divider).

In FIG. 7A, the PLL circuit 110 receives the reference clock signal (shown as refclk) and the feedback clock signal (shown as fbclk). Based on the refclk signal and the fbclk signal, the PLL circuit 110 outputs a signal along the signal line 117 (corresponding to the node A) to the clock dft circuit 230. The clock dft circuit 230 outputs the earlyclk signal along the signal line 235 to the clock distribution network 120.

The signal at node A (on signal line 117) is also input to a primary divide-by-N circuit 510 and to one input of the logical AND gate 140 (along signal line 505). The primary divide-by-N circuit 510 outputs the resulting signal along signal line 515 to one input of the logical AND gate 140. The logical AND gate 140 performs a logical AND operation on the feedback signals of the signal lines 515 and 505 and outputs the feedback clock (fbclk) signal to the PLL circuit 110.

The core clock signal may be output from the clock distribution network 120 at node B. The core clock signal may be input to a secondary divide-by-N circuit 520. The core clock signal may also be input to a logical AND gate 530. The secondary divide-by-N circuit 520 outputs a signal to another input of the logical AND gate 530. The logical AND gate 530 performs a logical AND operation on the input signals and provides the resulting signal along signal line 535 to the phase detector 210.

The phase detector 210 receives two inputs, namely the signal along the signal line 535 and a signal corresponding to the bclk signal along signal line 507. Based on these signals, the phase detector 210 outputs the adjustment signal along the signal line 215 to the variable delay circuit 220. The variable delay circuit 220 also receives a signal along signal line 508 from logical AND gate 105. The variable delay circuit 220 thereby adjusts the refclk signal input to the PLL circuit 110 based on the adjustment signal received along the signal line 215 from the phase detector 210.

Figure 7B:
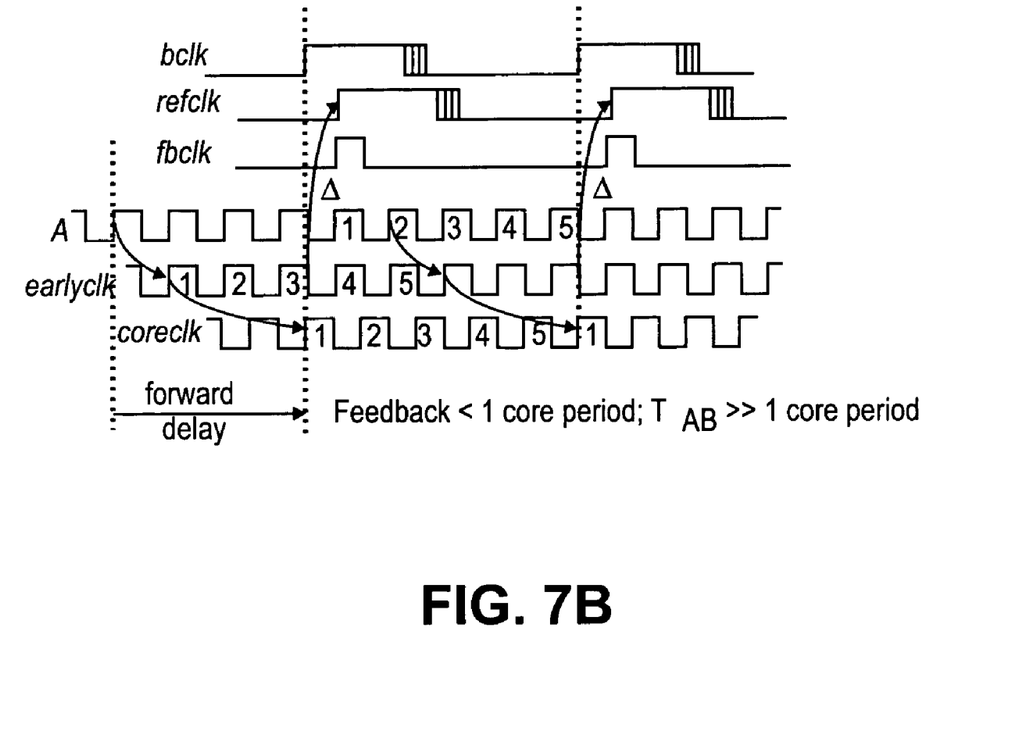
FIG. 7B is a timing diagram for the FIG. 7A circuit diagram.

FIG. 7B is a timing diagram showing the various signals of FIG. 7A over a period of time. For example, FIG. 7B shows the bus clock (bclk) signal and the feedback (fbclk) signal input to the PLL circuit 110. FIG. 7B also shows the signal at node A, the signal at node F, the earlyclk signal, and the signal at node B (i.e., the coreclk signal). The difference in the signals at node A and node B represents the forward delay (caused by the clock dft circuit 230 and the clock distribution network 120, for example). This figure shows the feedback delay between the signal at node A and the coreclk signal at node B ($T_{AB}$) as being much greater than 1 core clock period. In this example, the feedback is less than 1.

Figure 8:
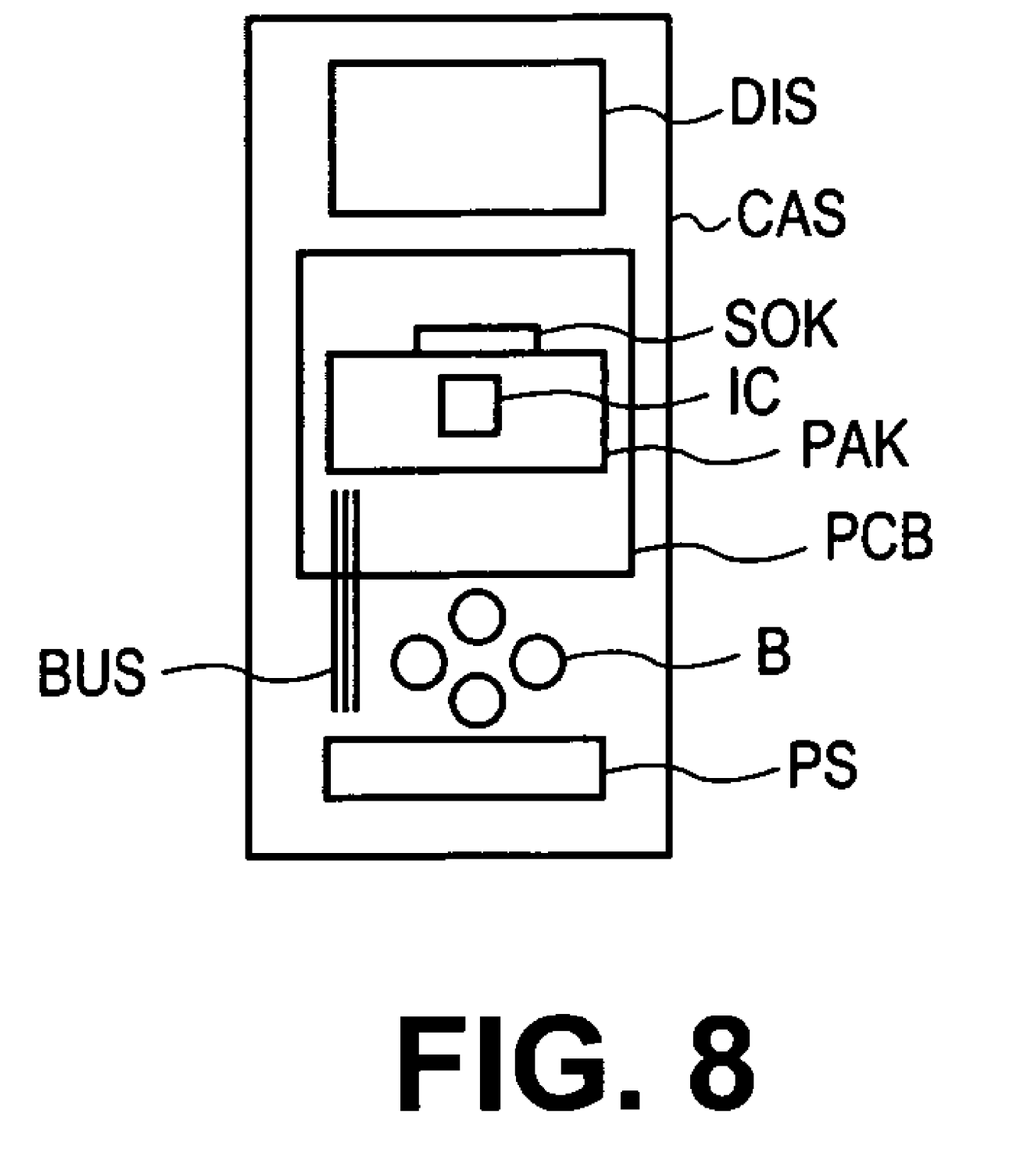
FIG. 8 is a block diagram of an example system incorporating embodiments of the present invention.

FIG. 8 illustrates an example electronic system arrangement that may incorporate implementations of the present invention. More particularly, shown is an integrated circuit (IC) chip that may incorporate one or more implementations of the present invention as an IC chip system. Such IC may be part of an electronic package PAK incorporating the IC together with supportive components onto a substrate such as a printed circuit board (PCB) as a packaged system. The packaged system may be mounted, for example, via a socket SOK onto a system board (e.g., a motherboard system (MB)). The system board may be part of an overall electronic device (e.g., computer, electronic consumer device, server, communication equipment) system that may also include one or more of the following items: input (e.g., user) buttons B, an output (e.g., display DIS), a bus or bus portion BUS, a power supply arrangement PS, and a case CAS (e.g., plastic or metal chassis).

Still further, embodiments within a scope of the present invention include simplistic level embodiments through system levels embodiments. For example, a discrete integrated circuit (IC) embodiment may likewise be implemented as: part of a chip or chipset embodiment; contained within a chip or chipset of a printed circuit board (e.g., motherboard) embodiment; contained within a chip or chipset of an electronic device such as a computing device (e.g., personal computer (PC), server) or a non-computing device (e.g., communications) device; and/or a machinery embodiment (e.g., automotive) containing the electronic device.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment or component, it is submitted that it is within the purview of one skilled in the art to effect such feature, structure, or characteristic in connection with other ones of the embodiments and/or components. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A system comprising:
    a phase lock loop component to output a first signal based on a reference clock signal and a feedback clock signal;
    a clock distribution network to distribute a clock signal based on the first signal output from the phase lock loop component, wherein the clock distribution network is outside a feedback path of the phase lock loop component; and
    a delay lock loop component to adjust the clock signal distributed by the clock distribution network, wherein the delay lock loop component comprises a phase detector and a variable delay circuit, the phase detector to output an adjustment signal to the variable delay circuit, and the phase detector is to compare a signal output from the variable delay circuit with the clock signal distributed by the clock distribution network to determine the adjustment signal;
    wherein the variable delay circuit is provided outside a feedback path of the phase lock loop component.

2. The system of claim 1, further comprising a divider circuit to lock the phase lock loop component.

3. The system of claim 1, wherein the delay lock loop component is to deskew the clock signal distributed by the clock distribution network up to a maximum of one period of said clock signal.

4. A system comprising:
    a phase lock loop component to output a first clock signal;
    a clock distribution network to provide a second clock signal based on the first clock signal output from the phase lock loop component, wherein the clock distribution network is outside a feedback path of the phase lock loop component; and
    a delay lock loop component to adjust a timing of the second clock signal, wherein the delay lock loop component comprises a phase detector and a variable delay circuit, the phase detector to output an adjustment signal to the variable delay circuit;
    wherein the variable delay circuit is provided outside the feedback path of the phase lock loop component.

5. The system of claim 4, further comprising a divider circuit to lock the phase lock loop component.

6. The system of claim 4, wherein the delay lock loop component is to adjust the timing of the second clock signal up to a maximum of one period of said second clock signal.

7. A system comprising:
    a phase lock loop component to output a first signal based on a reference clock signal and a feedback clock signal;
    a clock distribution network to distribute a clock signal based on the first signal output from the phase lock loop component, wherein the clock distribution network is outside a feedback path of the phase lock loop component; and
    a delay lock loop component to adjust the clock signal distributed by the clock distribution network, wherein the delay lock loop component comprises a phase detector and a variable delay circuit, the phase detector to output an adjustment signal to the variable delay circuit;

wherein the delay lock loop component is to deskew the clock signal distributed by the clock distribution network up to a maximum of one period of said clock signal.

8. A system comprising:

a phase lock loop component to output a first signal based on a reference clock signal and a feedback clock signal;

a clock distribution network to distribute a clock signal based on the first signal output from the phase lock loop component, wherein the clock distribution network is outside a feedback path of the phase lock loop component; and a delay lock loop component to adjust the clock signal distributed by the clock distribution network, wherein the delay lock loop component comprises a phase detector and a variable delay circuit, the phase detector to output an adjustment signal to the variable delay circuit, wherein the variable delay circuit is to output the reference clock signal to the phase lock loop component.

9. A system comprising:

a phase lock loop component to output a first signal based on a reference clock signal and a feedback clock signal;

a clock distribution network to distribute a clock signal based on the first signal output from the phase lock loop component, wherein the clock distribution network is outside a feedback path of the phase lock loop component; and a delay lock loop component to adjust the clock signal distributed by the clock distribution network, wherein a variable delay circuit is to receive a second signal and output the reference clock signal to the phase lock loop component, the variable delay circuit to adjust the reference clock signal based on an adjustment signal output from the phase detector.

10. The system of claim 9, wherein the adjustment signal is based on the clock signal distributed by the clock distribution network and the second signal.

11. A system comprising:

a phase lock loop component to output a first clock signal;

a clock distribution network to provide a second clock signal based on the first clock signal output from the phase lock loop component, wherein the clock distribution network is outside a feedback path of the phase lock loop component; and a delay lock loop component to adjust a timing of the second clock signal, wherein the delay lock loop component comprises a phase detector and a variable delay circuit, the phase detector to output an adjustment signal to the variable delay circuit, and wherein the variable delay circuit is to align the second clock signal with a feedback clock signal of the phase lock loop component;

wherein the delay lock loop component is to deskew the second clock signal distributed by the clock distribution network up to a maximum of one period of said clock signal.

12. A system comprising:

a phase lock loop component to output a first clock signal;

a clock distribution network to provide a second clock signal based on the first clock signal output from the phase lock loop component, wherein the clock distribution network is outside a feedback path of the phase lock loop component; and a delay lock loop component to adjust a timing of the second clock signal, wherein the delay lock loop component comprises a phase detector and a variable delay circuit, the phase detector to output an adjustment signal to the variable delay circuit, and wherein the variable delay circuit is to align the second clock signal with a feedback clock signal of the phase lock loop component, wherein the variable delay circuit is to receive a third signal and output a reference clock signal to the phase lock loop component, the variable delay circuit to adjust the reference clock signal based on the adjustment signal output from the phase detector.

13. The system of claim 12, wherein the adjustment signal is based on the second clock signal.

14. A system comprising:

a phase lock loop component to output a first signal based on a reference clock signal and a feedback clock signal;

a clock distribution network to distribute a clock signal based on the first signal output from the phase lock loop component, wherein the clock distribution network is outside a feedback path of the phase lock loop component; and a delay lock loop component to adjust the clock signal distributed by the clock distribution network, wherein the delay lock loop component comprises a phase detector and a variable delay circuit, the phase detector to output an adjustment signal to the variable delay circuit, and the phase detector is to compare a signal output from the variable delay circuit with the clock signal distributed by the clock distribution network to determine the adjustment signal;

wherein the delay lock loop component is to deskew the clock signal distributed by the clock distribution network up to a maximum of one period of said clock signal.

15. The system of claim 1, wherein the variable delay circuit is provided outside the feedback path of the phase lock loop component.

* * * * *